US008607170B2

(12) United States Patent  
Blatchford

(10) Patent No.: US 8,607,170 B2  
(45) Date of Patent: Dec. 10, 2013

(54) PERTURBATIONAL TECHNIQUE FOR CO-OPTIMIZING DESIGN RULES AND ILLUMINATION CONDITIONS FOR LITHOGRAPHY PROCESS

(75) Inventor: James Walter Blatchford, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/410,088

(22) Filed: Mar. 1, 2012

(65) Prior Publication Data

US 2012/0227015 A1    Sep. 6, 2012

Related U.S. Application Data

(60) Provisional application No. 61/448,415, filed on Mar. 2, 2011.

(51) Int. Cl.  
*G06F 17/50* (2006.01)

(52) U.S. Cl.  
USPC .......................................................... 716/52

(58) Field of Classification Search  
USPC .......................................................... 716/52  
See application file for complete search history.

(56) References Cited

U.S. PATENT DOCUMENTS

2011/0099526 A1* 4/2011 Liu ................................ 716/54  
2012/0216156 A1* 8/2012 Liu et al. ......................... 716/52

OTHER PUBLICATIONS

James W. Blatchford, Steven L. Prins, Scott W. Jessen, Thuc Dam, KiHo Baik, Linyong Pang and Bob Gleason, "Litho/Design Co-optimization and Area Scaling for the 22-nm Logic Node", Presented at the China Semiconductor International Conference 2010, Mar. 16-18, 2010, Shanghai, China, ECS Transactions 27 (1), 449 (2010). Published by The Electrochemical Society, Pennington, NJ.  
Rosenbluth et ali., "Optimum mask and source patterns to print a given shape" in Journal of Microlithography, Microfabrication and Microsystems, vol. 1, Issue 13 (2002), U.S.

* cited by examiner

*Primary Examiner* — Vuthe Siek  
*Assistant Examiner* — Mohammed Alam  
(74) *Attorney, Agent, or Firm* — Jacqueline J. Garner; Wade J. Brady III; Frederick J. Telecky Jr.

(57) ABSTRACT

A process of generating design rules, OPC rules and optimizing illumination source models for an integrated circuit layout, to form short lines, terminated lines and crossovers between adjacent parallel route tracks, may include the steps of generating a set of template structures which use a set of characteristic design rules, and performing a plurality of source mask optimization (SMO) operations on the set of template structures with different values for the design rules in each SMO operation. In a first embodiment, the SMO operations are run using a predetermined set of values for each of the design rules, spanning a desired range of design rule values. In a second embodiment, the SMO operations are performed in a conditional iterative process in which values of the design rules are adjusted after each iteration based on results of the iteration.

20 Claims, 6 Drawing Sheets

PERTURBATIONAL TECHNIQUE FOR CO-OPTIMIZING DESIGN RULES AND ILLUMINATION CONDITIONS FOR LITHOGRAPHY PROCESS

CROSS-REFERENCE TO RELATED APPLICATIONS

This application claims the benefit of priority under U.S.C. §119(e) of U.S. Provisional Application 61/448,415, filed Mar. 2, 2011.

FIELD OF THE INVENTION

This invention relates to the field of integrated circuits. More particularly, this invention relates to processes for forming integrated circuits.

BACKGROUND OF THE INVENTION

Integrated circuits may be formed using photolithography processes with illuminations sources having wavelengths more than twice a desired pitch of metal interconnect lines in the integrated circuits. Attaining desired tradeoffs between fabrication costs and fabrication yield may be difficult. For example, technology nodes at and beyond the 28 nanometer node using 193 nanometer illumination sources may require more than one pattern step to obtain desired first metal interconnect layouts. Providing design rules, optical proximity correction (OPC) rules and optimizing illumination source models to form short lines, terminated lines and crossovers between adjacent parallel route tracks with desired lateral dimensions may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A process of generating design rules, OPC rules and optimizing illumination source models for an integrated circuit layout, to form short lines, terminated lines and crossovers between adjacent parallel route tracks, may include the steps of generating a set of template structures which use a set of characteristic design rules, and performing a plurality of source mask optimization (SMO) operations on the set of template structures with different values for the design rules in each SMO operation. In a first embodiment, the SMO operations are run using a predetermined set of values for each of the design rules, spanning a desired range of design rule values. In a second embodiment, the SMO operations are performed in a conditional iterative process in which values of the design rules are adjusted after each iteration based on results of the iteration.

DETAILED DESCRIPTION OF EXAMPLE EMBODIMENTS

Figure 1:
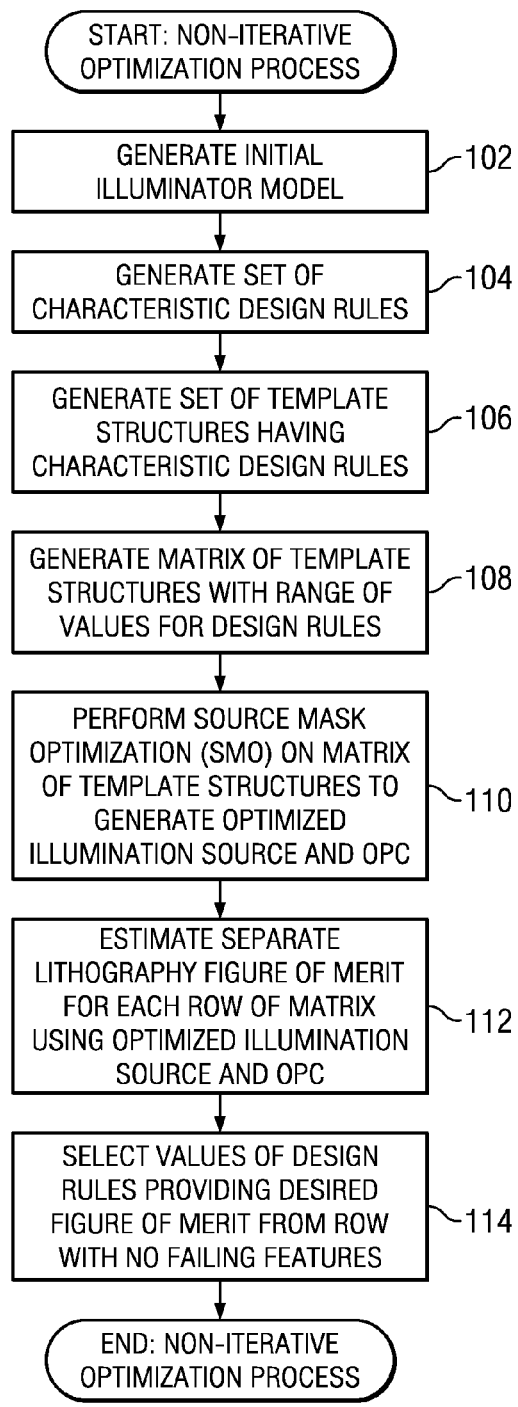
FIG. 1 is a flow chart of a non-iterative process of optimizing design rules, OPC rules and illumination source models according to the first embodiment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A process of generating design rules, OPC rules and optimizing illumination source models for an integrated circuit layout, to form short lines, terminated lines and crossovers between adjacent parallel route tracks, may include the steps of generating a set of template structures which use a set of characteristic design rules, and performing a plurality of SMO operations on the set of template structures with different values for the design rules in each SMO operation. In a first embodiment, the SMO operations are run using a predetermined set of values for each of the design rules, spanning a desired range of design rule values. In a second embodiment, the SMO operations are performed in a conditional iterative process in which values of the design rules are adjusted after each iteration based on results of the iteration.

Figure 2:
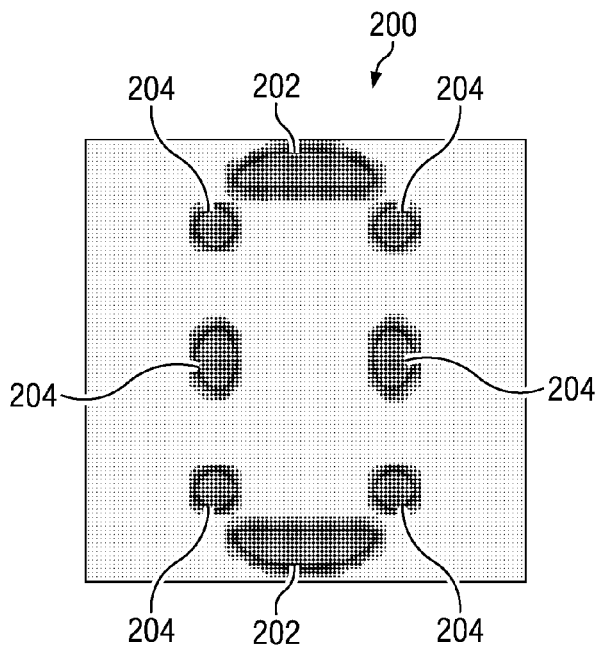
FIG. 2 depicts an exemplary initial illuminator model.

FIG. 1 is a flow chart of a non-iterative process of generating design rules for an integrated circuit layout according to the first embodiment. The non-iterative process 100 begins with step 102 to generate an initial model for an illuminator for a photolithographic process to be used for forming integrated circuits. FIG. 2 depicts an exemplary initial illuminator model. The off-axis illumination source model 200 has a moderate dipole component. The emitting area is configured in two large dipole regions 202 along the vertical direction and smaller source regions 204 along the horizontal and diagonal directions.

Figure 3:
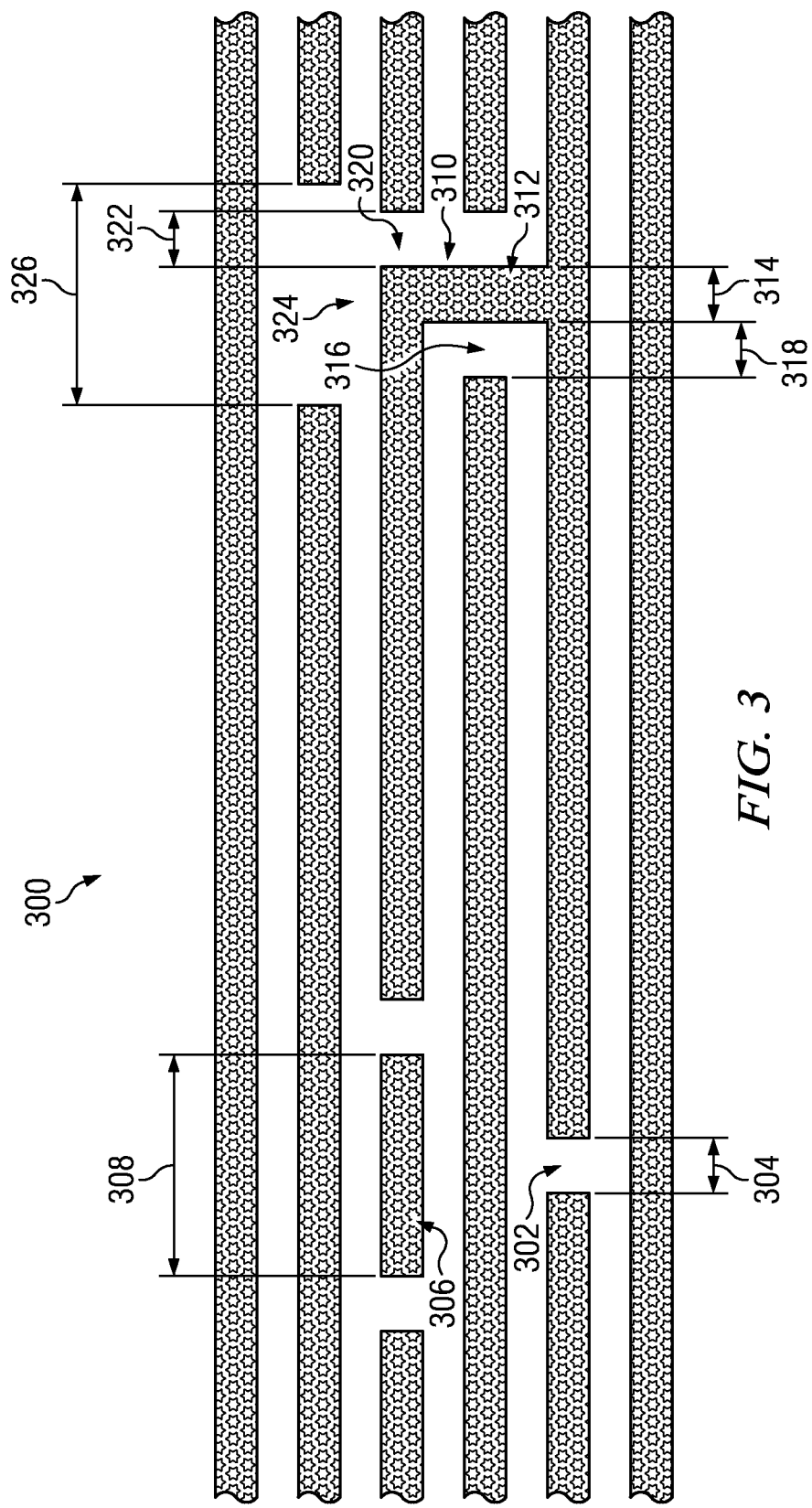
FIG. 3 is a top view of an interconnect layout which illustrate an exemplary set of design rules of interest.

The non-iterative process 100 continues with step 104 to generate a set of characteristic design rules. The design rules may be, for example, a set of design rules which cover a desired fraction of layout feature encountered in an integrated circuit of interest. FIG. 3 is a top view of an interconnect layout which illustrate an exemplary set of design rules of interest. Interconnects in FIG. 3 are depicted with a star hatch pattern. The layout 300 includes a line space feature 302 which is laid out using a line space design rule 304. The layout 300 includes a short line feature 306 which is laid out using a short line design rule 308. The layout 300 includes a crossover 310 with a crossover width feature 312 which is laid out using a crossover width design rule 314. The layout 300 includes a line-end to crossover feature 316 which is laid out using a line-end to crossover design rule 318. The layout 300 includes a line-end to crossover corner feature 320 which is laid out using a line-end to crossover corner design rule 322. The layout 300 includes a crossover exclusion zone feature 324 which is laid out using a crossover exclusion zone design rule 326.

Figure 4:
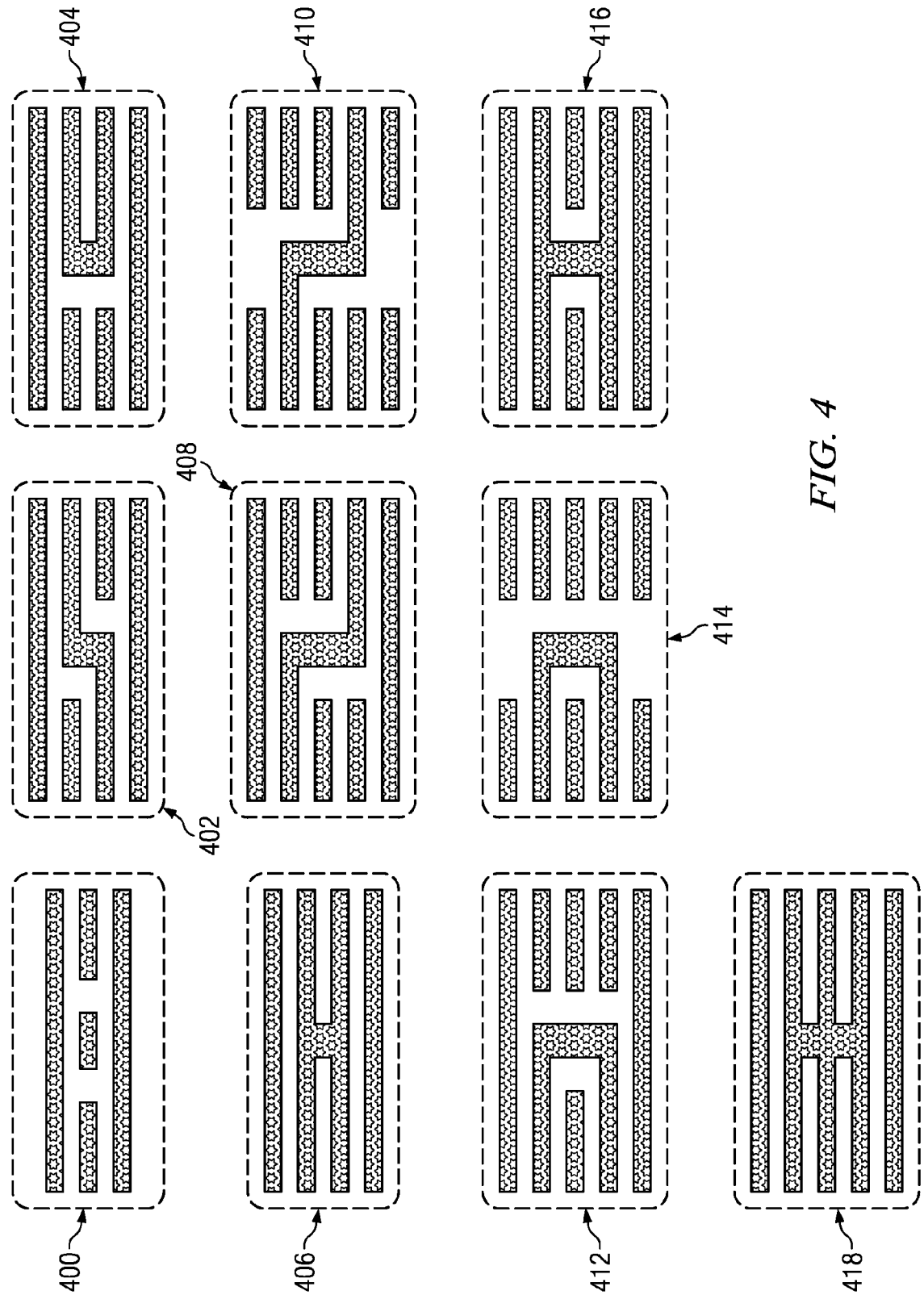
FIG. 4 is an exemplary set template structures which use a characteristic set of design rules.

The non-iterative process 100 continues with step 106 to generate a set of template structures which use the set of design rules generated in step 104. FIG. 4 is an exemplary set template structures which use a characteristic set of design rules, for example the design rules described in reference to FIG. 3. Interconnects in FIG. 4 are depicted with a star hatch pattern. A first template structure 400 may have, for example, the line space feature 302 and the short line feature 306, and hence use the line space design rule 304 and the short line design rule 308. A second template structure 402 may have, for example, the crossover width feature 312 and the line-end to crossover corner feature 320, and hence use the crossover width design rule 314 and the line-end to crossover corner design rule 322. A third template structure 404 may have, for example, the crossover width feature 312 and the line-end to crossover corner feature 320 in a different configuration from the second template structure 402, and hence use the crossover width design rule 314 and the line-end to crossover corner design rule 322. A fourth template structure 406 may have, for example, the crossover width feature 312 in a different configuration from the third template structure 404, and hence use the crossover width design rule 314. A fifth template structure 408 may have, for example, the crossover width feature 312, the line-end to crossover feature 316 and the line-end to crossover corner feature 320, and hence use the crossover width design rule 314, the line-end to crossover design rule 318 and the line-end to crossover corner design rule 322. A sixth template structure 410 may have, for example, the crossover width feature 312, the line-end to crossover feature 316, the line-end to crossover corner feature 320 and the crossover exclusion zone feature 324, and hence use the crossover width design rule 314, the line-end to crossover design rule 318, the line-end to crossover corner design rule 322 and the crossover exclusion zone design rule 326. A seventh template structure 412 may have, for example, the crossover width feature 312, the line-end to crossover feature 316 and the line-end to crossover corner feature 320 in a different configuration than the fifth template structure 408, and hence use the crossover width design rule 314, the line-end to crossover design rule 318 and the line-end to crossover corner design rule 322. An eighth template structure 414 may have, for example, the crossover width feature 312, the line-end to crossover feature 316, the line-end to crossover corner feature 320 and the crossover exclusion zone feature 324 in a different configuration than the sixth template structure 410, and hence use the crossover width design rule 314, the line-end to crossover design rule 318, the line-end to crossover corner design rule 322 and the crossover exclusion zone design rule 326. A ninth template structure 416 may have, for example, the crossover width feature 312 and the line-end to crossover feature 316 in a different configuration than the fifth template structure 408, and hence use the crossover width design rule 314 and the line-end to crossover design rule 318. A tenth template structure 418 may have, for example, the crossover width feature 312 in a different configuration than the ninth template structure 416, and hence use the crossover width design rule 314.

Figure 5:
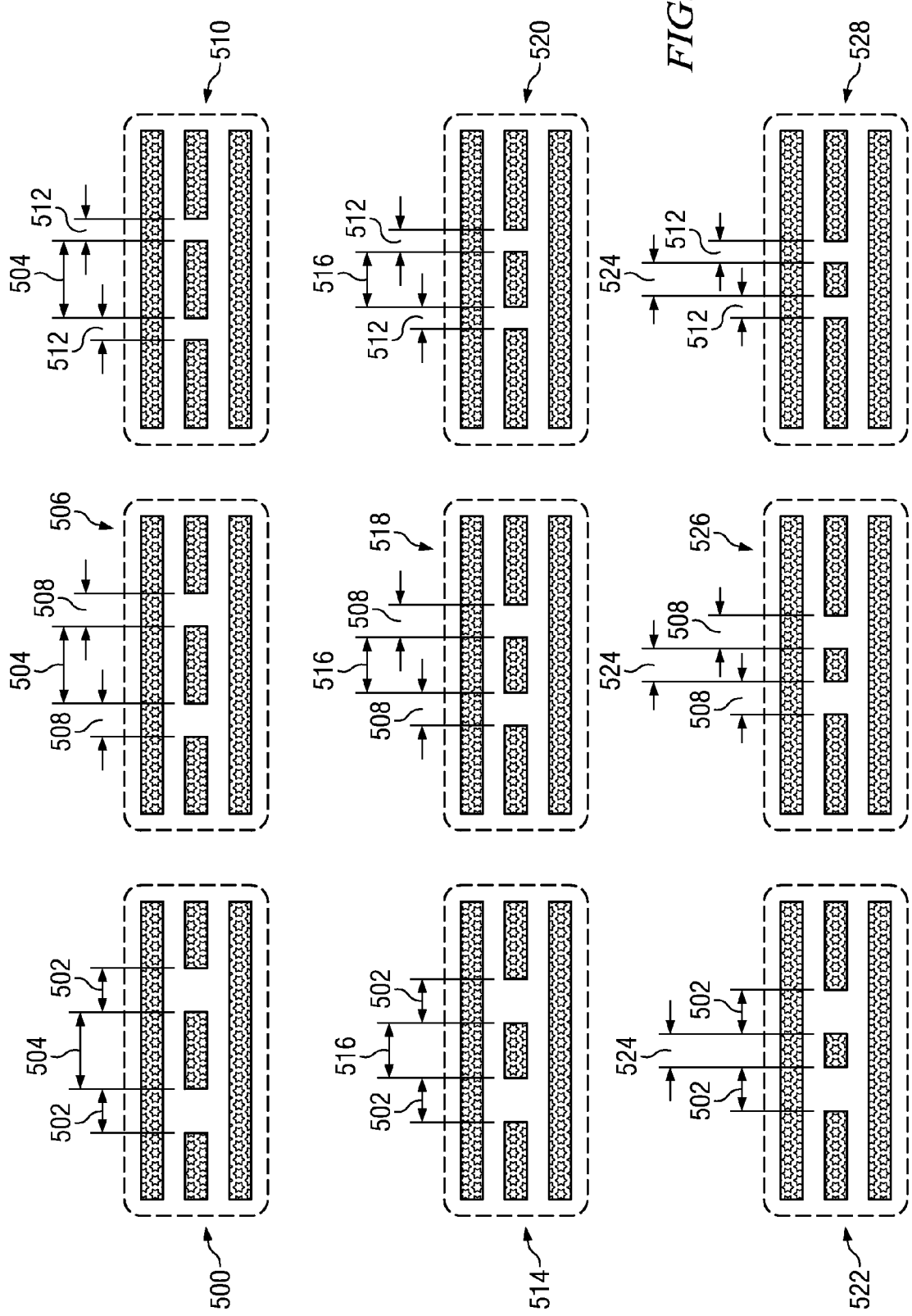
FIG. 5 is a portion of a matrix of template structures.

The non-iterative process 100 continues with step 108 to generate a matrix of the template structures from step 106 with a range of values for the relevant design rules. FIG. 5 is a portion of a matrix, showing instances of the first template structure 400 from FIG. 4 with a range of three values each for the line space design rule 304 and the short line design rule 308. Interconnects in FIG. 5 are depicted with a star hatch pattern. A first instance 500 of the first template structure has a first line space design rule value 502 and a first short line design rule value 504. A second instance 506 of the first template structure has a second line space design rule value 508 and the same short line design rule value 504 as the first instance 500 of the first template structure. A third instance 510 of the first template structure has a third line space design rule value 512 and the same short line design rule value 504 as the first instance 500 of the first template structure.

A fourth instance 514 of the first template structure has the same line space design rule value 502 as the first instance 500 of the first template structure and a second short line design rule value 516. A fifth instance 518 of the first template structure has the same line space design rule value 508 as the second instance 506 of the first template structure and the same short line design rule value 516 as the fourth instance 514 of the first template structure. A sixth instance 520 of the first template structure has the same line space design rule value 512 as the third instance 510 of the first template structure and the same short line design rule value 516 as the fourth instance 514 of the first template structure.

A seventh instance 522 of the first template structure has the same line space design rule value 502 as the first instance 500 of the first template structure and a third short line design rule value 524. An eighth instance 526 of the first template structure has the same line space design rule value 508 as the second instance 506 of the first template structure and the same short line design rule value 524 as the seventh instance 522 of the first template structure. A ninth instance 528 of the first template structure has the same line space design rule value 512 as the third instance 510 of the first template structure and the same short line design rule value 524 as the seventh instance 522 of the first template structure.

Figure 6:
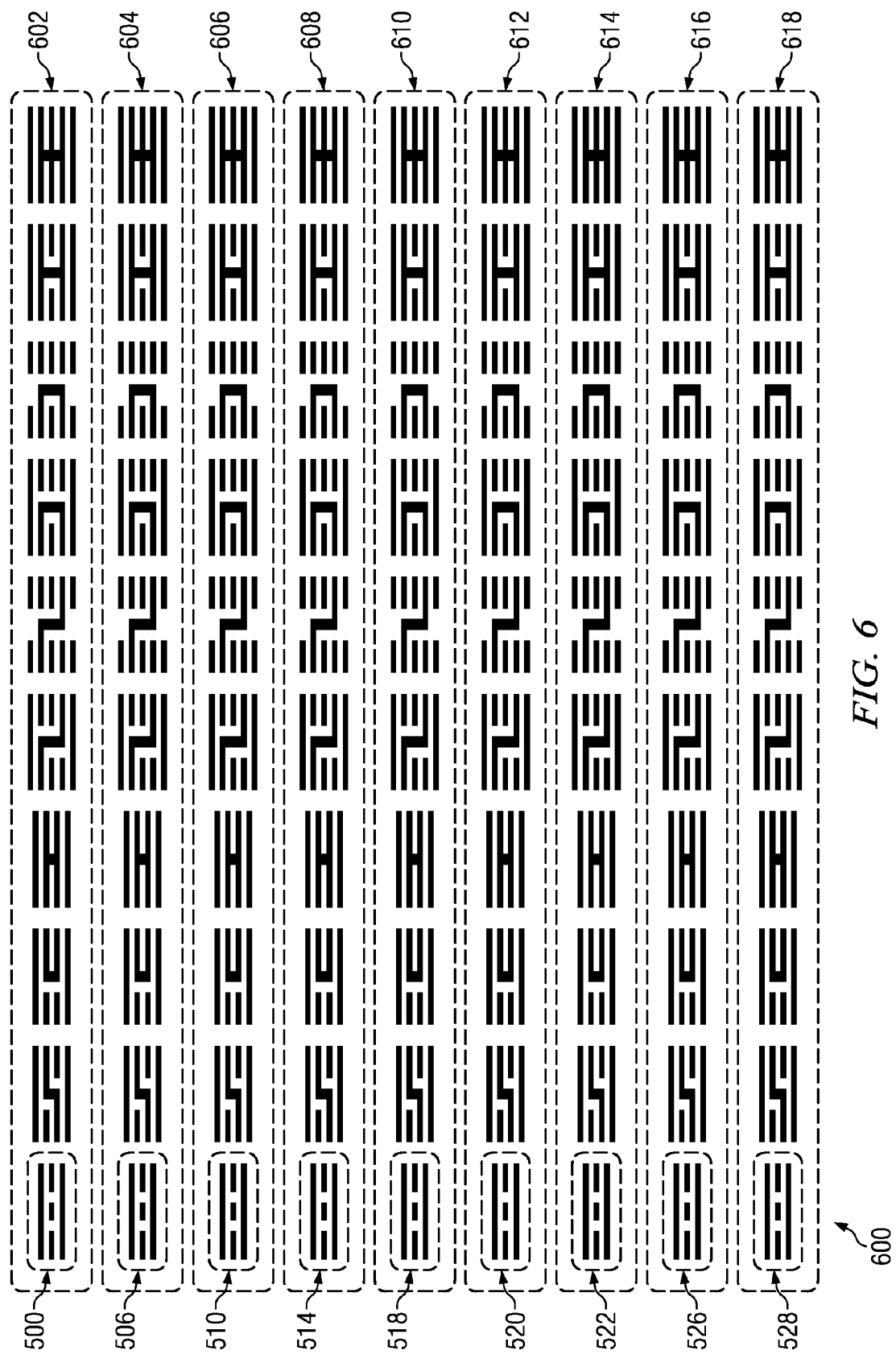
FIG. 6 depicts a matrix generated according to the instant embodiment.

Similar design rule value ranges may be applied to the remaining template structures 402 through 418 in the set of template structures from step 104 to generate a first instance through a ninth instance of each template structure 402 through 418 to provide a complete matrix of ten template structures 400 through 418 times nine instances per template structure in step 108. FIG. 6 depicts a matrix generated according to the instant embodiment. The matrix 600 has nine rows 602 through 618. Each matrix row 602 through 618 includes one instance of each of the template structures 400 through 418, with a different set of design rule values in each row 602 through 618. Every instance of a particular design rule has a same value in a given row. For example, every instance of the line-end to crossover corner design rule 322 in the first row 602 has a first same value. Every instance of the line-end to crossover corner design rule 322 in the second row 604 has a second same value, which may be different from the first value. In the instant embodiment, the matrix 600 includes nine rows. The first template structure 500 of the first matrix row 602 is the first instance 500 of the first template structure having the first line space design rule value 502 and the first short line design rule value 504 as depicted in FIG. 5. The first template structure 506 of the second matrix row 604 is the second instance 506 of the first template structure as depicted in FIG. 5, and similarly for the first template structure in each remaining matrix row 608 through 618. It will be recognized that the matrix may include more values of each design rules, so that the matrix includes more than nine instances of each template structure.

The non-iterative process 100 continues with step 110 to perform SMO operations on the matrix 600 generated in step 108. The SMO operation optimizes all instances of the template structures in the matrix rows 602 through 618 simultaneously. Each SMO operation starts with the initial illuminator model generated in step 102. Specific steps of the SMO process may be found in the open literature, for example Rosenbluth et al., "Optimum mask and source patterns to print a given shape" in Journal of Microlithography, Microfabrication and Microsystems, Volume 1, Issue 13 2002. A common illuminator model is optimized for all instances of the template structures 400 through 418 in the matrix 600, so that step 110 provides a single common optimized illumination source model for all the matrix rows 602 through 618 and an optimized mask geometry for each instance of the template structures 400 through 418 for the instant design rule values, in the matrix 600.

Subsequently, step 112 is performed, in which a separate lithography figure of merit is estimated for each matrix row 602 through 618 for printed patterns of the template structures printed using an illumination source based on the optimized illumination source model and optimized mask geometries for that row provided by the SMO operation of step 110. The lithography figure of merit may include, for example, any combination of parameters such as depth of focus (DOF), mask error enhancement factor (MEEF), exposure latitude, critical dimension (CD) uniformity, and line end pullback. An estimation procedure for the figure of merit may weight the parameters with different weight values, for example depending on an expected frequency of occurrence in the integrated circuit. Step 112 also notes instances of features which are estimated to fail to print correctly, for example features of separated lines for which photolithographic patterns are estimated to fail to separate from each other, referred to as failing features. Instances of failing features reduce the lithography figure of merit for the instant row containing the failing features.

Subsequently, step 114 is performed, in which a set of design rule values is selected from the results of the SMO operation of step 110 corresponding to a desired value of the lithography figure of merit with no failing features, provided by step 112, and to use the selected design rule values to fabricate the integrated circuit. The desired value is selected from matrix rows 602 through 618 which do not have any instances of features which are estimated to fail to print correctly, and which may, for example, provide an estimated minimum area of the integrated circuit. The selected set of design rule values may be used to generate a mask layout for an integrated circuit and the corresponding illumination source model may then be used to fabricate the integrated circuit.

Figure 7:
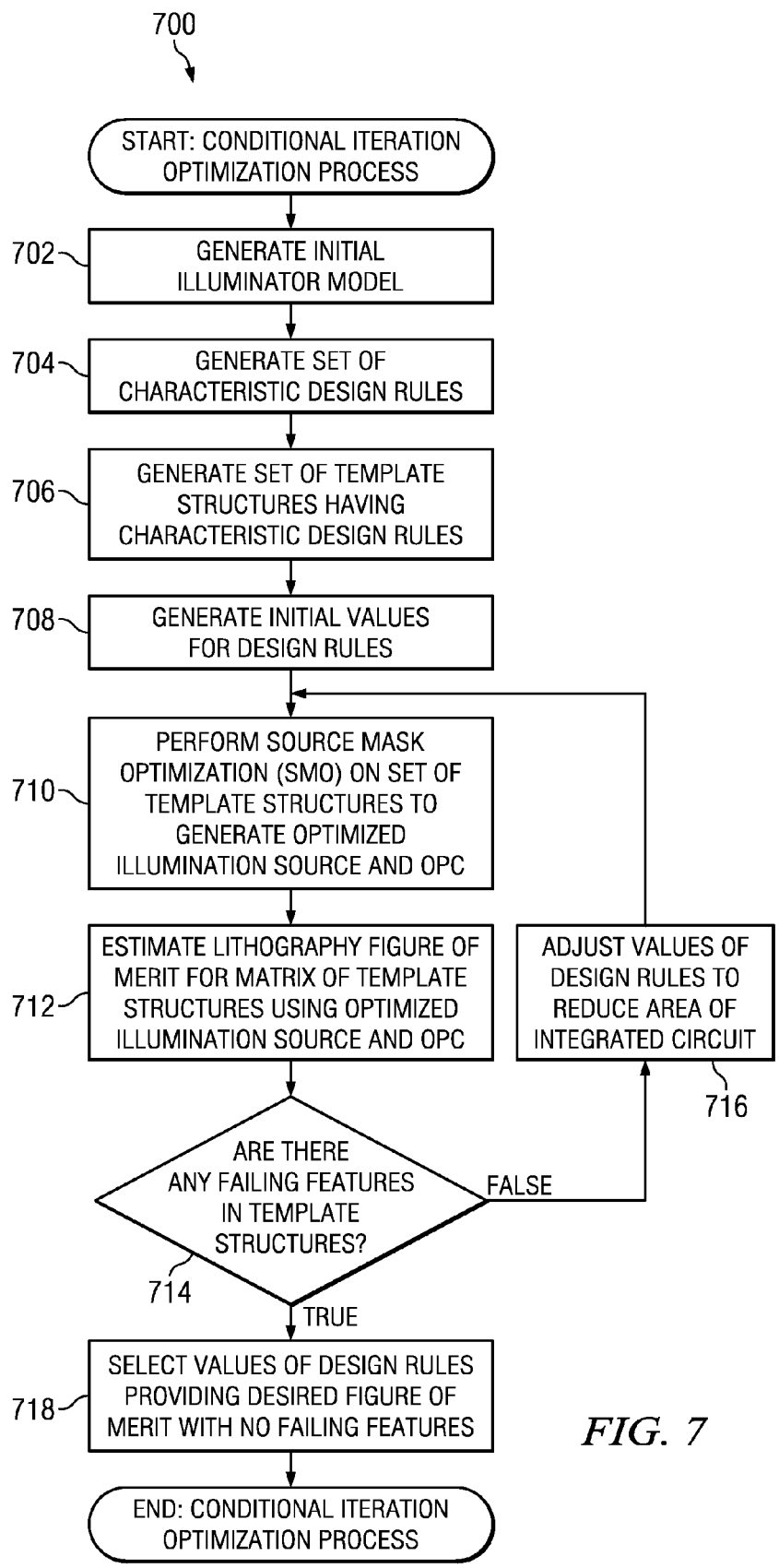
FIG. 7 is a flow chart of a conditional iterative process of optimizing design rules, OPC rules and illumination source models according to the second embodiment.

FIG. 7 is a flow chart of a conditional iterative process of generating design rules for an integrated circuit layout according to the second embodiment. The conditional iterative process 700 begins with step 702 to generate an initial model for an illuminator for a photolithographic process to be used for forming integrated circuits, as described with respect to step 102 in FIG. 1. The conditional iterative process 700 continues with step 704 to generate a set of template structures which use a characteristic set of design rules, as described in reference to step 104 of FIG. 1. The characteristic design rules may include, for example, the design rules discussed in reference to FIG. 3. Subsequently, step 706 is performed in which a set of template structures is generated which use the set of design rules generated in step 704. The set of template structures may include, for example, the template structures discussed in reference to FIG. 4.

The conditional iterative process 700 continues with step 708 to generate initial values for the design rules selected in step 704. The initial design rule values may be, for example, similar to the values used in the first matrix row 602 as discussed in reference to FIG. 6. Other initial values for the design rules are within the scope of the instant embodiment.

The conditional iterative process 700 continues with step 710 to perform SMO operations on each instance of the template structures generated in step 706 starting with the design rule values generated in step 708. The SMO operations are described in reference to step 110 of FIG. 1. Step 710 provides a common optimized illumination source model for the set of template structures, and an optimized mask geometry for each instance of the template structures of step 706 for the design rule values of step 708.

After the SMO operations of step 710 are completed, step 712 is performed in which a lithography figure of merit is estimated for printed patterns of the set of template structures when printed using an illumination source based on the optimized illumination source model and optimized mask geometries provided by the SMO operation of step 710. The lithography of merit may be generated, for example, as discussed in reference to step 112 of FIG. 1.

After the lithography figure of merit is estimated in step 712, step 714 is performed, which determines if the printed patterns of the set of template structures have any failing features. If a FALSE condition is obtained, in which the printed patterns of the set of template structures do not have any failing features, step 716 is performed. If a TRUE condition is obtained, in which the printed patterns of the set of template structures do have any failing features, step 718 is performed.

Step 716 is to adjust the values of the design rules used by the template structures, so as to reduce the area of the integrated circuit. The adjustment may include, for example, incrementally relaxing rules associated with features of the template structures which degrade the lithography figure of merit, and incrementally tightening rules associated with features of the template structures which have some margin with respect to the lithography figure of merit. After step 716 is completed, the conditional iterative process 700 returns to step 710 for another iteration of steps 710, 712 and 714.

Step 718 is to select the values of the design rules providing a desired value of the lithography figure of merit corresponding to an iteration of the SMO operation which produced no failing features and to use the selected design rule values to fabricate the integrated circuit. The selected set of design rule values and corresponding set of OPC rules from the last iteration of step 710 with no failing features may be used to generate a mask layout for an integrated circuit. The illumination source model from the same last iteration of step 710 with no failing features may then be used to fabricate the integrated circuit.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of generating design rules for an integrated circuit layout by a non-iterative process, comprising the steps of:
generating, by a computer, an initial model for an illuminator for a photolithographic process;
generating a set of characteristic design rules for layout features of said integrated circuit layout;
generating a set of template structures which use said set of design rules;
generating a matrix of said template structures with a range of values for said design rules, so that each row of said matrix includes one instance of each of said of said template structures, with a different set of said values of said design rules in each said row;
performing a source mask optimization (SMO) operation on each instance of said template structures in each of said matrix rows, starting with said initial model for said illuminator, in which said illuminator model is optimized for all instances of said template structures in said matrix, so that said SMO operation provides a separate optimized mask geometry for each instance of said template structures in each of said matrix rows;
estimating a lithography figure of merit for each said matrix row, for printed patterns of said template structures when printed using an illumination source based on said optimized illumination source model and optimized mask geometries for said matrix row provided by said SMO operation on said matrix row, and noting instances of failing features which are estimated to fail to print correctly;
selecting design rules values from said range of design rule values corresponding to a desired value of said lithography figure of merit with no failing features; and
fabricating said integrated circuit using said selected design rules.

2. The process of claim 1, in which said step of estimating said lithography figure of merit includes depth of focus (DOF) and mask error enhancement factor (MEEF).

3. The process of claim 1, in which said step of estimating said lithography figure of merit includes exposure latitude.

4. The process of claim 1, in which said step of estimating said lithography figure of merit includes critical dimension (CD) uniformity, and line end pullback.

5. The process of claim 1, in which an instance of said template structures includes a line space feature.

6. The process of claim 1, in which an instance of said template structures includes a short line feature.

7. The process of claim 1, in which an instance of said template structures includes a crossover width feature.

8. The process of claim 1, in which an instance of said template structures includes a line-end to crossover corner feature.

9. The process of claim 1, in which an instance of said template structures includes a line-end to crossover feature.

10. The process of claim 1, in which an instance of said template structures includes a crossover exclusion zone feature.

11. A process of generating design rules for an integrated circuit layout by a conditional iterative process, comprising the steps of:
generating, by a computer, an initial model for an illuminator for a photolithographic process;
generating a set of characteristic design rules for layout features of said integrated circuit layout;
generating a set of template structures which use said set of design rules;
generating initial values for said design rules;
performing an SMO operation on each instance of said template structures, starting with said initial model for said illuminator, in which said illuminator model is optimized for all said template structures, so that said SMO operation provides an optimized illumination source model and a separate optimized mask geometry for each instance of said template structures;
estimating a lithography figure of merit for printed patterns of said template structures when printed using an illumination source based on said optimized illumination source model and optimized mask geometries provided by said SMO operation, and noting instances of failing features which are estimated to fail to print correctly;
determining if said printed patterns of said set of template structures have any failing features;
if said printed patterns of said set of template structures do not have any failing features, then adjusting said values of said design rules used by said template structures so as to reduce an area of said integrated circuit, and continuing said conditional iterative process with said step of performing said SMO operation;
if said printed patterns of said set of template structures do have any failing features, then selecting said design rules which provided a desired value of said lithography figure of merit with no failing features; and
fabricating said integrated circuit using said selected design rules.

12. The process of claim 11, in which said step of estimating said lithography figure of merit includes DOF and MEEF.

13. The process of claim 11, in which said step of estimating said lithography figure of merit includes exposure latitude.

14. The process of claim 11, in which said step of estimating said lithography figure of merit includes CD uniformity, and line end pullback.

15. The process of claim 11, in which an instance of said template structures includes a line space feature.

16. The process of claim 11, in which an instance of said template structures includes a short line feature.

17. The process of claim 11, in which an instance of said template structures includes a crossover width feature.

18. The process of claim 11, in which an instance of said template structures includes a line-end to crossover corner feature.

19. The process of claim 11, in which an instance of said template structures includes a line-end to crossover feature.

20. The process of claim 11, in which an instance of said template structures includes a crossover exclusion zone feature.

* * * * *